(12) United States Patent
Fukaya (10) Patent No.: US 10,194,570 B2
(45) Date of Patent: Jan. 29, 2019

(54) MOUNTER AND METHOD FOR INSPECTING SUCTION POSTURE OF ELECTRONIC COMPONENT USING MOUNTER

(71) Applicant: FUJI CORPORATION, Chiryu-shi (JP)

(72) Inventor: Yoshiyuki Fukaya, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/524,051

(22) PCT Filed: Nov. 13, 2014

(86) PCT No.: PCT/JP2014/080069
§ 371 (c)(1),
(2) Date: May 3, 2017

(87) PCT Pub. No.: WO2016/075790
PCT Pub. Date: May 19, 2016

(65) Prior Publication Data
US 2017/0318715 A1 Nov. 2, 2017

(51) Int. Cl.
*G06K 9/00* (2006.01)
*H05K 13/08* (2006.01)
(Continued)

(52) U.S. Cl.
CPC .......... *H05K 13/08* (2013.01); *G06T 7/0004* (2013.01); *H05K 13/0408* (2013.01); *H05K 13/0812* (2018.08); *G06T 2207/30141* (2013.01)

(58) Field of Classification Search
None
See application file for complete search history.

(56) References Cited

U.S. PATENT DOCUMENTS 6,435,808 B1 * 8/2002 Araya ................ H05K 13/0812
414/783
7,617,597 B2 * 11/2009 Okuda ............... H05K 13/0812
29/833
(Continued)

FOREIGN PATENT DOCUMENTS

JP 2000-277999 A 10/2000
JP 2009-38340 A 2/2009
(Continued)

OTHER PUBLICATIONS

International Search Report dated Feb. 17, 2015, in PCT/JP2014/080069 filed Nov. 13, 2014.

*Primary Examiner* — Randolph I Chu
(74) *Attorney, Agent, or Firm* — Oblon, McClelland, Maier & Neustadt, L.L.P.

(57) ABSTRACT

A mounter is provided with a head unit with a suction nozzle capable of picking up an electronic component that transfers the electronic component to a specified position, an imaging device that images the pickup orientation of the electronic component, a component data acquiring device that acquires the size of the electronic component, an image processing section that image processes the captured image, and an image processing pattern selecting section. The image processing pattern selecting section, based on the size of the electronic component, is able to select one image processing range and one image processing accuracy from multiple predetermined image processing ranges and multiple predetermined printing accuracies, and, as the size of the electronic component acquired from the component data acquiring section becomes smaller, selects a smaller image processing range and a more accurate image processing accuracy from the multiple image processing ranges and multiple image processing accuracies.

7 Claims, 8 Drawing Sheets

(51) Int. Cl.
    *G06T 7/00*         (2017.01)
    *H05K 13/04*     (2006.01)

(56)           References Cited

U.S. PATENT DOCUMENTS

| | | | |
|---|---|---|---|
| 8,136,219 B2* | 3/2012 | Endo | H05K 13/04 29/593 |
| 8,673,685 B1* | 3/2014 | Maeda | H05K 13/0465 438/108 |
| 9,615,495 B2* | 4/2017 | Itoh | H05K 13/08 |
| 9,621,777 B2* | 4/2017 | Onishi | H05K 13/0452 |
| 9,629,292 B2* | 4/2017 | Itoh | H05K 13/08 |
| 9,661,793 B2* | 5/2017 | Itoh | H05K 13/08 |
| 9,880,548 B2* | 1/2018 | Maenishi | G05B 19/41865 |
| 2003/0029033 A1* | 2/2003 | Hidese | H01L 21/67144 29/833 |
| 2003/0093896 A1* | 5/2003 | Usui | H05K 13/0452 29/743 |
| 2010/0152877 A1 | 6/2010 | Maenishi | |
| 2016/0210747 A1* | 7/2016 | Hay | G06T 7/11 |

FOREIGN PATENT DOCUMENTS

| | | |
|---|---|---|
| JP | 2009-188265 A | 8/2009 |
| WO | WO 2008/142864 A1 | 11/2008 |

\* cited by examiner

MOUNTER AND METHOD FOR INSPECTING SUCTION POSTURE OF ELECTRONIC COMPONENT USING MOUNTER

TECHNICAL FIELD

Technology disclosed in the present specification relates to a mounter and method for inspecting the pickup orientation of an electronic component using the mounter.

BACKGROUND ART

Generally, mounters that mount electronic components on circuit boards are provided with a head unit, an imaging device, and an image processing section. The head unit includes suction nozzles capable of picking up electronic components, and transfers the electronic components to a specified position on a circuit board. The imaging device images the pickup orientation of the electronic component (hereinafter also referred to as a picked component) picked up by a suction nozzle. The image processing section image processes image data captured by the imaging device and calculates the position correction amount, thickness, and so on of the electronic component. The mounter mounts the electronic component based on the result calculated by the image processing section.

Disclosed in JP-A-2009-188265 is a mounter provided with a head-side imaging device attached to a head unit, and a base-side imaging device, provided on a base, that has a wider field of view and higher resolution than the head-side imaging device. With this mounter, when imaging the pickup orientation of a picked component, the head-side imaging device is selected for electronic components with a size that is within the imaging range of the head-side imaging device, and the base-side imaging device is selected for electronic components with a size that exceeds the imaging range of the head-side imaging device. Accordingly, even if the size of an electronic component exceeds the imaging range of the head-side imaging device, the electronic component can be reliably imaged by the base-side imaging device.

SUMMARY

Problem to be Solved

Recently, electronic components are getting smaller. Therefore, it is difficult to image process with good accuracy the pickup orientation of small components using conventional image processing accuracy. If the pickup orientation of an electronic component cannot be image processed with good accuracy, the position correction amount, thickness, and so on of the electronic component cannot be calculated reliably, leading to a problem that the electronic component cannot be mounted on the board at the specified position.

With the mounter of JP-A-2009-188265, in a case in which the size of an electronic component is within the imaging range of the head-side imaging device, the head-side imaging device, which has a relatively narrow field of view and relatively low resolution, is selected. Therefore, when mounting small electronic components on a circuit board, usually, the head-side imaging device is selected, the electronic component is imaged by the head-side imaging device, and image processing is performed on the captured image. As a result, the time required for image processing is short, but there is a problem in that image processing of the pickup orientation of the electronic component cannot be performed with good accuracy.

The present specification discloses technology that allows appropriately accurate image processing of small electronic components, while curtailing an increase in the image processing time.

Means for Solving the Problem

The mounter disclosed in the present specification is provided with a head unit, an imaging device, a component data acquiring section, an image processing section, and an image processing pattern selecting section. The head unit includes suction nozzles capable of picking up electronic components, and transfers the electronic components to a specified position on a circuit board. The imaging device images the pickup orientation of the electronic component picked up by a suction nozzle. The component data acquiring section acquires the size of the electronic component. The image processing section processes an image captured by the imaging device. The image processing pattern selecting section selects an image processing range and image processing accuracy of the image processing section. The image processing pattern selecting section, based on the size of the electronic component, is able to select one image processing range from multiple predetermined image processing ranges, is able to select one image processing accuracy from multiple predetermined printing accuracies, and, as the size of the electronic component acquired from the component data acquiring section becomes smaller, selects a smaller image processing range from the multiple image processing ranges, and selects a more accurate image processing accuracy from the multiple image processing accuracies. The image processing section performs image processing according to the image processing range and the image processing accuracy selected by the image processing pattern selecting section.

With the above mounter, the image processing pattern selecting section selects a more accurate image processing accuracy as the size of the electronic components gets smaller. Therefore, it is possible to appropriately image process the pickup orientation even in a case in which the electronic component is small, and the electronic component can be accurately mounted at a specified position on a circuit board. Also, generally, as the image processing accuracy improves, the image processing time per unit of surface area increases, but with the above configuration, when the image processing accuracy is high, the image processing range is made smaller, which curtails the time required for image processing the entire image processing range. Accordingly, it is possible to perform appropriately accurate image processing of small electronic components, while curtailing an increase in the image processing time.

Also, the present specification discloses a new head unit. This head unit includes suction nozzles capable of picking up electronic components, and transfers the electronic components to a specified position on a circuit board; further, a head-side imaging processing unit that images the pickup orientation of an electronic component picked up by a suction nozzle is attachable to the head unit. The head unit is provided with a component data acquiring section, an image processing section, and an image processing pattern selecting section. The component data acquiring section acquires the size of the electronic component. The image processing section processes an image captured by the head-side imaging device. The image processing pattern selecting section selects an image processing range and image processing accuracy of the image processing section. The image processing pattern selecting section, based on the size of the electronic component, is able to select one image processing range from multiple predetermined image processing ranges, is able to select one image processing accuracy from multiple predetermined printing accuracies, and, as the size of the electronic component acquired from the component data acquiring section becomes smaller, selects a smaller image processing range from the multiple image processing ranges, and selects a more accurate image processing accuracy from the multiple image processing accuracies. The image processing section performs image processing according to the image processing range and image processing accuracy selected by the image processing pattern selecting section.

The above head is provided internally with a component data acquiring section, an image processing section, and an image processing pattern selecting section. With this configuration too, it is possible to perform appropriately accurate image processing of small electronic components, while curtailing an increase in the image processing time.

Further, this specification discloses a new electronic component pickup orientation inspection method. This pickup orientation inspection method is a method for inspecting the pickup orientation of an electronic component picked up by a suction nozzle in a mounter that mounts an electronic component picked up by a suction nozzle at a specified location on a board. The pickup orientation inspection method includes a processing step, an imaging step, a selecting step, and an image processing step. In the acquiring step, the size of the electronic component picked up by the suction nozzle is acquired. In the imaging step, the pickup orientation of the electronic component picked up by the suction nozzle is imaged. In the selecting step, the image processing range and the image processing accuracy for the image captured in the imaging step are selected based on the size of the electronic component acquired in the acquiring step. In the image processing step, the image captured in the imaging step is image processed using the image processing range and the image processing accuracy selected in the selecting step. In the selecting step, it is possible to select one image processing range from multiple predetermined image processing ranges, it is possible to select one image processing accuracy from multiple predetermined processing accuracies, and, as the size of the electronic component acquired from the component data acquiring section becomes smaller, a smaller image processing range is selected from the multiple image processing ranges, and a more accurate image processing accuracy is selected from the multiple image processing accuracies. According to this inspection method, it is possible to perform appropriately accurate image processing of small electronic components, while curtailing an increase in the image processing time.

DESCRIPTION OF EMBODIMENTS

The main features of embodiments are described below as examples of the disclosure. Note that, technical elements described in this specification and in the drawings exhibit technical utility alone or in various combinations, and are not limited to the combination of the described aspects of the application.

In the mounter disclosed in this specification, the image processing range selected by the image processing selecting section may be a set range that is larger than the outline of the electronic component as seen from the imaging direction of the imaging device. According to this configuration, because the overall outline of the electronic component is a target for image processing, it is possible to accurately inspect the pickup orientation of the electronic component.

With the mounter disclosed in the present specification, the image processing pattern selecting section may select a first image processing range and a first image processing accuracy in a case in which the size of the electronic component acquired by the component data acquiring section is equal to or greater than a threshold value, and may select a second image processing range that is smaller than the first image processing range and a second image processing accuracy that is more accurate than the first image processing accuracy in a case in which the size of the electronic component acquired by the component data acquiring section is less than the threshold value. According to this configuration, by appropriately setting a threshold at which to switch the selection of the image processing range and the image processing accuracy, it is possible to improve the mounting accuracy of electronic components and to improve the mounting efficiency of electronic components.

With the mounter disclosed in this specification, a memory may be provided that memorizes the sizes of the multiple image processing ranges. According to this configuration, when changing the size of the image processing range, changing is easy by rewriting the memory.

First Embodiment

Mounter 10 of an embodiment is described with reference to the figures. Mounter 10 is a device that mounts electronic components 4 on circuit board 2. Mounter 10 is also known as an electronic component mounting device or a chip mounter. Usually, mounter 10 is set up with other board work machines such as a solder printer and board inspection machine to form a mounting line.

Figure 1:
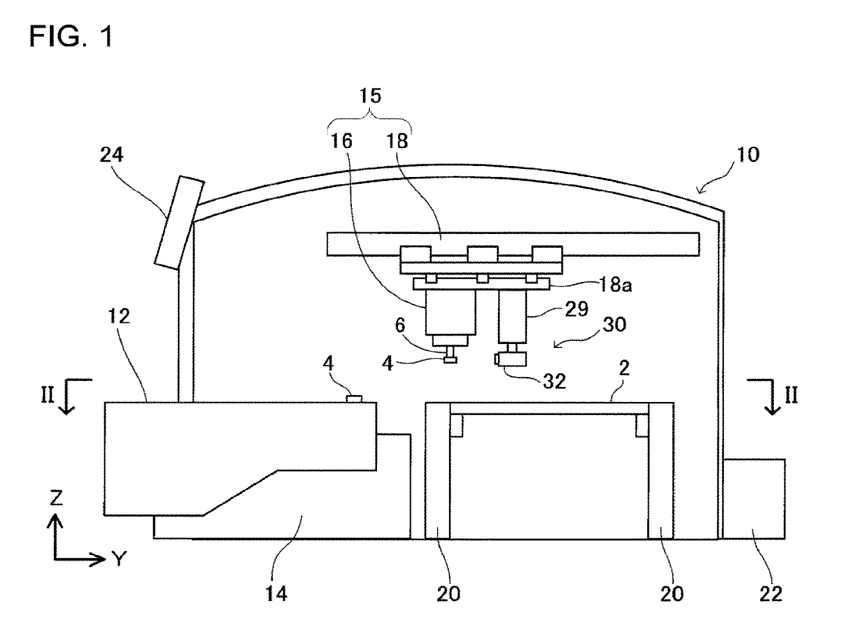
FIG. 1 is a side view conceptually showing the configuration of a mounter of an embodiment.
Figure 2:
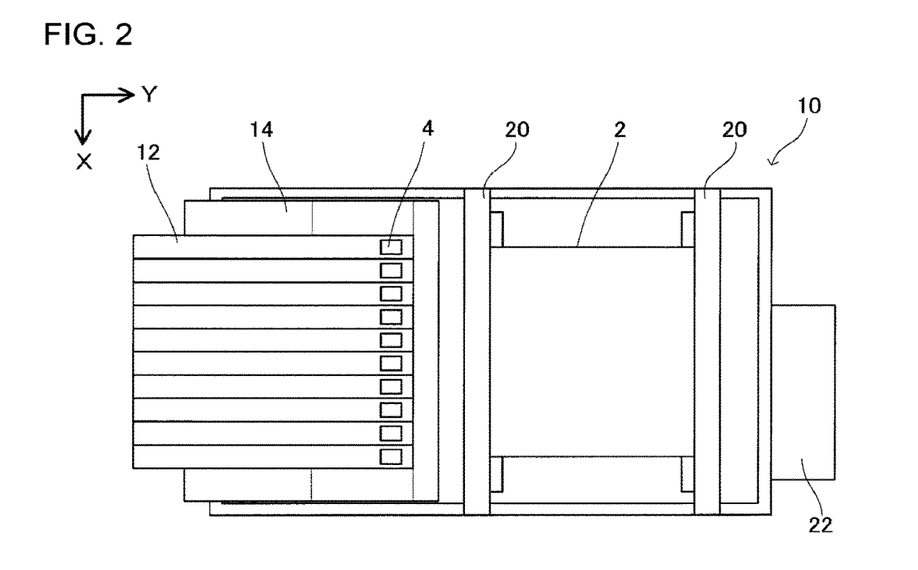
FIG. 2 is a cross section along the lines II-II of FIG. 1.

As shown in FIGS. 1 and 2, mounter 10 is provided with multiple component feeders 12, feeder holding section 14, head unit 15 configured from mounting head 16 and head moving device 18, imaging device 30, board conveyor 20, control device 22, and touch panel 24. Each component feeder 12 stores multiple electronic components 4. Component feeders 12 are detachably attached to feeder holding section 14, and supply electronic components 4 to mounting head 16. The specific configuration of component feeders 12 is not particularly limited. Each component feeder 12, for example, may be a tape type feeder that stores multiple electronic components 4 in wound tape, a tray type feeder that stores multiple electronic components 4 on a tray, or a bulk type feeder that stores multiple electronic components 4 in a loose state in a container. Also, feeder holding section 14 may be fixed to mounter 10, or may be detachable from mounter 10.

Mounting head 16 includes nozzle 6 that picks up electronic component 4. Nozzle 6 is detachably attached to mounting head 16. Mounting head 16 is able to move nozzle 6 in the Z direction (here a vertical direction), so as to move nozzle 6 towards and away from component feeder 12 and circuit board 2. Mounting head 16 picks up electronic component 4 from component feeder 12, and mounts electronic component 4 picked up by nozzle 6 on circuit board 2. Note that, mounting head 16 may include only a single nozzle 6, or may include multiple nozzles 6.

Head moving device 18 moves mounting head 16 and fixing member 29 (described later) between component feeder 12 and circuit board 2. As one example, head moving device 18 of the present embodiment is an XY robot that moves moving base 18a in the X direction and Y direction, with mounting head 16 being fixed to moving base 18a. Head unit 15 is configured from mounting head 16 and head moving device 18. Note that, mounting head 16 is not limited to being fixed to moving base 18a, and may be detachably attached to moving base 18a.

Figure 4:
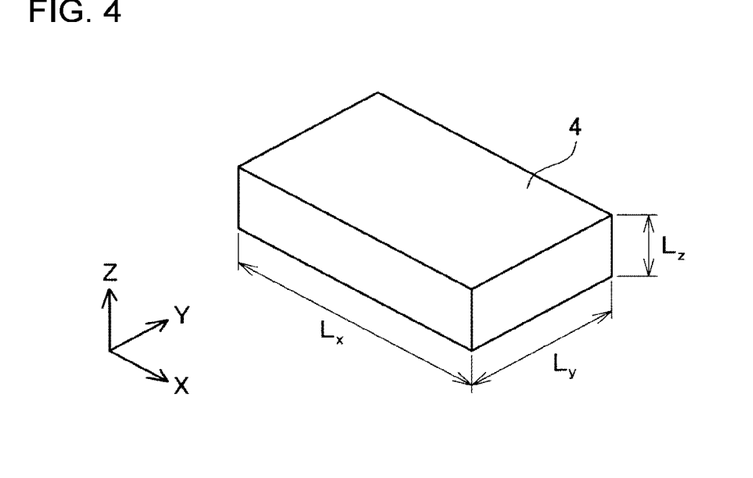
FIG. 4 is a perspective view conceptually showing an electronic component.

Imaging device 30 is fixed to moving base 18a by fixing member 29, and moves together with moving base 18a. Imaging device 30 is provided with camera 32, a light source for illumination (not shown), and a prism (not shown). Camera 32 images the side surface (refer to FIG. 4 [hereinafter this is also referred to as the side surface of electronic component 4]) in the ZX plane direction of electronic component 4 picked up by nozzle 6, and a lower section of nozzle 6 from the horizontal direction (that is, the −Y direction). Camera 32 is, for example, a CCD camera. The light source for illumination is configured from LEDs and illuminates the imaging surface of electronic component 4. The prism aligns the light axis of camera 32 with the imaging target. The side surface of electronic component 4 in the ZX plane direction and the lower section of nozzle 6 are illuminated by the light source for illumination, and light reflected therefrom is reflected by the prism into camera 32, such that camera 32 images the side surface of electronic component 4 and the lower section of nozzle 6. Image data of the image captured by camera 32 is sent to image processing section 52 (see below) of control device 22. Note that, camera 32 is not limited to imaging the side surface of electronic component 4 in the ZX plane direction, and may image the lower surface of electronic component 4, or may selectively image the side surface or the lower surface of electronic component 4 (or may image both).

Board conveyor 20 is a device that performs loading, positioning, and unloading of circuit board 2. As an example, board conveyor 20 of the present embodiment includes a pair of belt conveyors, and a holding device that holds circuit board 2 from below.

Figure 3:
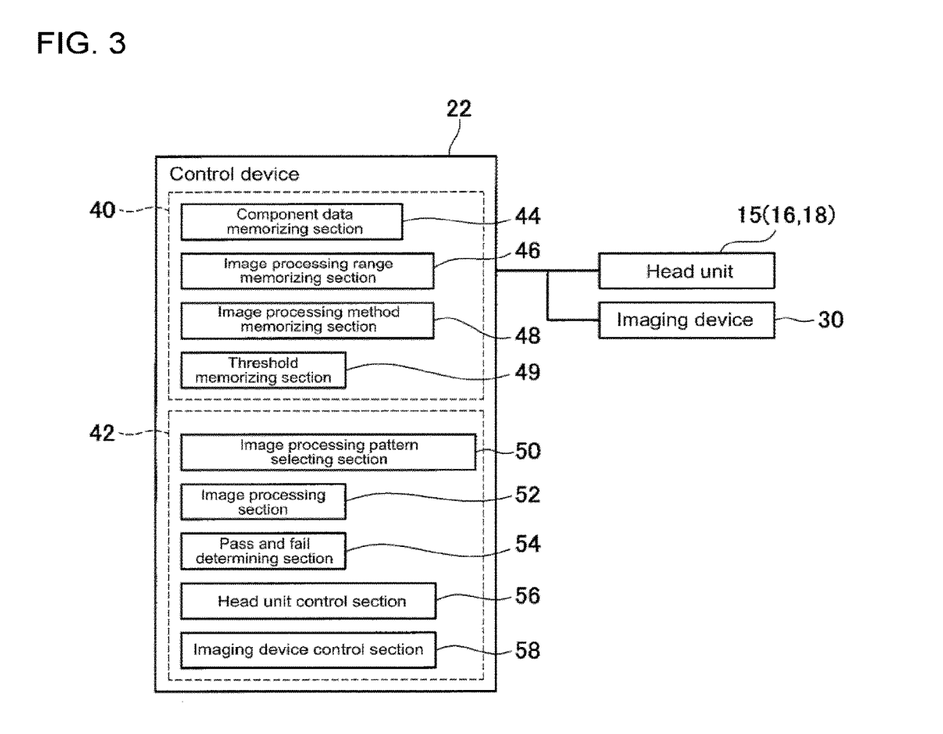
FIG. 3 is a block diagram showing control device functions.

As shown in FIG. 3, control device 22 is configured from a computer that includes memory 40 and CPU 42. Component data memorizing section 44, image processing range memorizing section 46, image processing method memorizing section 48, and threshold memorizing section 49 are provided in memory 40. Component data memorizing section 44 memorizes component data related to all the various types of electronic components 4 to be mounted on circuit board 2. Specifically, component data memorizing section 44 memorizes the size of the side surface of electronic component 4 in the ZX plane direction (that is, width Lx and thickness Lz of electronic component 4 [refer to FIG. 4]), linked to an allowance value for the size of the side surface of electronic component 4, the type of circuit board 2, the component type (chip component, leaded component, and so on), the package type (QFP, BGA, and so on), order to be transferred by head unit 15, mounting position on circuit board 2, and the like. Image processing range memorizing device 46 memorizes the size of two types of image processing ranges, 60 and 62 (refer to FIGS. 5 and 6). The size of image processing range 62 is larger than the size of image processing range 60. It is easy to change the size of the image processing range by changing the size of the image processing range memorized in image processing range memorizing section 46. Image processing method memorizing section 48 memorizes two types of image processing methods (that is, image processing programs). Specifically, image processing method memorizing section 48 memorizes a caliper tool and a binarization method. Generally, image processing accuracy using the caliper tool is higher than the image processing accuracy using the binarization method. Threshold memorizing section 49 memorizes width Lxth and thickness Lzth as thresholds for the size of the side surface in the ZX plane of electronic component 4. These threshold values can be set by an operator. Note that, component data memorizing section 44 corresponds to an example of a "component data acquiring section," image processing range 60 corresponds to an example of a "second image processing range," and image processing range 62 corresponds to an example of a "first image processing range." Also, the image processing accuracy using the caliper tool corresponds to an example of a "second image processing accuracy," and the binarization method corresponds to an example of a "first image processing accuracy."

A calculating program is memorized on memory 40, and by CPU 42 running the calculating program, CPU 42 functions as image processing pattern selecting section 50, image processing section 52, pass and fail determining section 54, head unit control section 56, and imaging device control section 58. Image processing pattern selecting section 50, based on the size of the side surface of electronic component 4 acquired from component data memorizing section 44, selects the size of the image processing range to be either image processing range 60 or image processing range 62 from image processing range memorizing section 46, and selects the image processing method to be either the binarization method or the calipers method from image processing method memorizing section 48. Specifically, image processing pattern selecting section 50 selects either the combination of image processing range 60 and calipers tool, or the combination of image processing range 62 and binarization method. Image processing section 52 image processes image data sent from camera 32 using the image processing range and image processing method selected by image processing pattern selecting section 50, and calculates the size of the side surface of electronic component 4 and the correction amount for the mounting position. Pass and fail determining section 54 determines whether electronic component 4 can be mounted from the calculation result of image processing section 52. Head unit control section 56 controls operation of head unit 15. Imaging device control section 58 controls operation of imaging device 30.

Touch panel 24 is a display device for providing various information to an operator, and a user interface for receiving various instructions and information from an operator. For example, the determination result of image processing by control device 22 can be displayed to an operator.

Next, operation of mounter 10 during mounting of electronic component 4 is described with reference to the flowchart of FIG. 7. Note that, mounter 10 of the present embodiment mounts multiple types of electronic components 4 on circuit board 2. Electronic components 4 to be mounted on circuit board 2 include relatively large electronic components and relatively small electronic components. As described above, with the present embodiment, the image processing range and image processing method are switched based on the size of the side surface of electronic component in the ZX plane direction. Therefore, before mounting electronic components with mounter 10, the thresholds (that is, Lxth, Lzth) of electronic components 4 to be used for switching the image processing range and the image processing method are set in advance. The set thresholds are memorized in threshold memorizing section 49 of control device 22. The setting of the thresholds of electronic components 4 may be set by an operator operating touch panel 24. Also, component data of all electronic components 4 to be mounted on circuit board 2 by mounter 10 is also memorized in advance on component data memorizing section 44 of control device 22. Specifically, component data of electronic components 4 is memorized in advanced in component data memorizing section 44 in the order in which the electronic components are to be mounted on circuit board 2.

Figure 7:
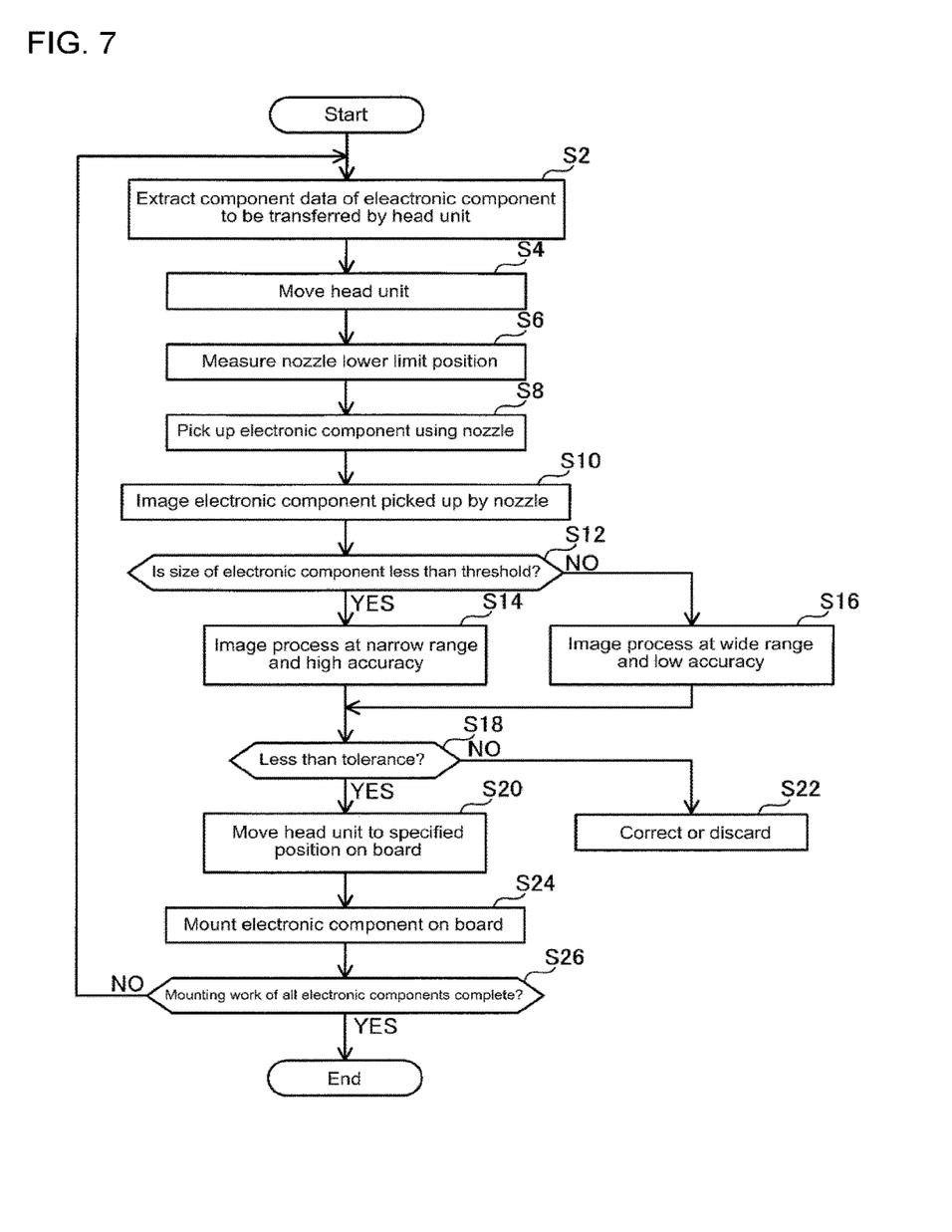
FIG. 7 is a flowchart of mounter operations.

When electronic components 4 are mounted on circuit board 2, as shown in FIG. 7, control section 22 extracts component data of electronic component 4 to be transferred by head unit 15 and mounted on circuit board 2 from component data memorizing section 44 (step S2). That is, in a case of electronic component 4 of ordinal number i to be mounted on circuit board 2, component data of the ordinal number i electronic component 4 to be mounted is extracted from component data memorizing section 44. By this, the size (width Lx, thickness Lz) of the side surface in the ZX plane direction of the electronic component 4 to be mounted and the mounting position and the like of the electronic component 4 to be mounted is identified.

Next, because the electronic component 4 to be mounted on circuit board 2 has been identified, control device 22 moves head unit 15 to the component feeder 12 that supplies the electronic component 4 identified in step S2 (step S4). That is, head unit control section 56 positions mounting head 16 with respect to the identified feeder 12 by driving head moving device 18. By this, nozzle 6 of mounting head 16 is positioned above electronic component 4 of component feeder 12. Next, imaging device control device 58 of control device 22 images the lower section of nozzle 6 from the horizontal direction using camera 32, and calculates the lower limit position of nozzle 6 in the imaging range (step S6). Because nozzle 6 is movable with respect to mounting head 16 in the Z direction, the lower limit position of nozzle 6 is calculated in camera 32 before electronic component 4 is picked up by nozzle 6. The calculated lower limit position of nozzle 6 is memorized in memory 40. Continuing, head unit control section 56 of control device 22 picks up electronic component 4 from component feeder 12 using nozzle 6 by lowering nozzle 6 with respect to mounting head 16 (step S8). Then, imaging device control section 58 images the side surface (side surface in the ZX plane direction) of electronic component 4 and the lower section of nozzle 6 from a horizontal direction (that is, the −Y direction) using camera 32 (step S10). Here, the imaging range of camera 32 is set in advance such that the outline of electronic component 4 when looking from the −Y direction is within the imaging range of camera 32. With the present embodiment, the imaging range of camera 32 is fixed regardless of the size of electronic component 4. Therefore, the imaging range of camera 32 is set to be larger than the outline of the electronic component 4 with the largest side surface in a ZX plane direction from among the electronic components 4. Note that, the processing of step S6 corresponds to an example of an "acquiring step," and the processing of S10 corresponds to an example of an "imaging step."

Continuing, using the component data extracted in step S2, control device 22 determines whether the size of the side surface in the ZX plane direction of electronic component 4 picked up by nozzle 6 in step S8 is less than the threshold value (that is, Lxth, Lzth) set in advance. In a case in which the component data of electronic component 4 picked up by nozzle 6 (strictly speaking, the size of the side surface in the ZX plane direction of electronic component 4) satisfies the following conditions: Lx<Lxth, and Lz<Lzth (that is, "Yes" in step S12), image processing pattern selecting section 50 selects image processing range 60 (refer to FIG. 5) from image processing range memorizing section 46, and selects the caliper tool from image processing method memorizing section 48, then proceeds to step S14. On the other hand, in a case in which the component data of electronic component 4 picked up by nozzle 6 does not satisfy the above conditions (that is, "No" in step S12), processing pattern selecting section 50 selects image processing range 62 (refer to FIG. 6) from image processing range memorizing section 46, and selects the binarization method from image processing method memorizing section 48, then proceeds to step S16. Below, electronic components that satisfy the above conditions are given as electronic components 4a, and electronic components that do not satisfy the above conditions are given as electronic components 4b. Note that, step S12 corresponds to an example of a "selecting step."

In step S14, image processing section 52 image processes image data sent from camera 32. The image data has size 70 (refer to FIGS. 5 and 6), which corresponds to the imaging range of camera 32. Image processing section 52 image processes (refer to FIG. 5) the range in the image data demarcated by image processing range 60. In other words, image processing section 52 does not image process all of the image data, but selectively image processes a portion of the image data. Image processing range 60 is set to be a size such that the outline when looking from the −Y direction of electronic component 4a that satisfies the above conditions fits within image processing range 60. Therefore, the entire side surface in the ZX plane direction of electronic component 4a is a target for image processing. Image processing section 52 image processes image data using the caliper tool. The caliper tool is a well known image processing method, and is configured from an affine transformation step, a projection processing step, and a filter processing step. The caliper tool is able to detect edges at a sub-pixel level, and is able to image process at a level at or above the pixel resolution of camera 32. Image processing section 52 detects edges using the caliper tool by image processing image data inside image processing range 60 moving up (that is, in the Z direction). Then, the edge detected at the lowest position is determined to be the lower limit position of electronic component 4a. Here, because the lower limit position of nozzle 6 is calculated in step S6, by calculating the difference between the lower limit position of electronic component 4a and the lower limit position of nozzle 6, it is possible to calculated thickness Lz1 of electronic component 4a.

Conversely, in step S16, image processing section 52 image processes image data sent from camera 32. Image processing section 52 image processes (refer to FIG. 6) the range in the image data demarcated by image processing range 62 (that is, a range larger than image processing range 60 used in step S14). Image processing range 62 is set to be a size such that the outline when looking from the −Y direction of electronic component 4b that does not satisfy the above conditions fits within image processing range 62.

Figure 6:
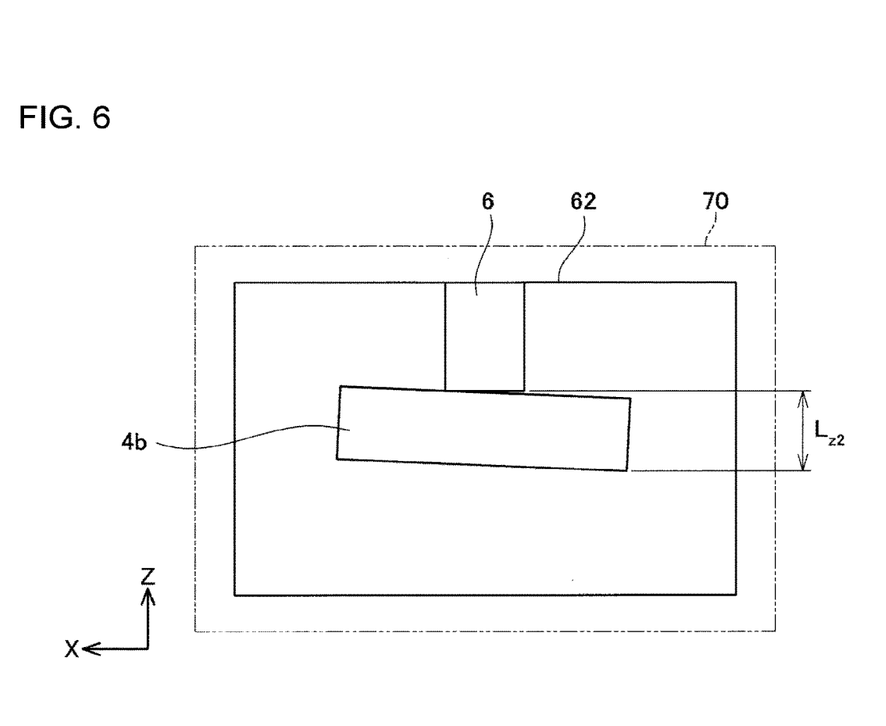
FIG. 6 is a different example of an image processing range.

Therefore, the entire side surface in the ZX plane direction of electronic component 4b is a target for image processing. Image processing section 52 image processes image data using the binarization method. The binarization method is a well known image processing method in which a grayscale image is transformed into an image with only two shades. With the binarization method, a binarization threshold value is set in advance, and by binarizing each pixel such that pixels equal to or greater than the binarization threshold value are made white, and pixels less than the binarization threshold value are made black, electronic component 4b is distinguished from the background of the image. Therefore, with the binarization method, it is not possible to image process with an accuracy greater than the pixel resolution of camera 32. The method for calculating the thickness of electronic component 4b is the same as step S14. That is, image processing section 52 detects the lowermost position at which the color changes (for example, from black to white) by image processing image data inside image processing range 62 moving up using the binarization method, and determines that lowermost position as the lower limit position of electronic component 4b. Then, the thickness Lz2 of electronic component 4b is calculated by calculating the difference between the lower limit position of electronic component 4b and the lower limit position of nozzle 6 measured in step S6. Note that, the processing of step S14 and step S16 corresponds to an example of an "image processing step."

Continuing, pass and fail determining section 54 determines whether thickness Lz1 of electronic component 4a calculated in step S14 or thickness Lz2 of electronic component 4b calculated in step S16 is less than an allowance value (step S18). The allowance value is memorized in component data memorizing section 44 linked to the size of electronic component 4a or 4b, and is a fixed value for each electronic component 4a and 4b. In a case in which thickness Lz1 or thickness Lz2 is equal to or greater than the allowance value (that is, "No" in step S18), there is an error with the pickup orientation of electronic component 4a or 4b, or the size of electronic component 4a or 4b exceeds a tolerance value, therefore the pickup orientation of electronic component 4a or 4b is corrected, or electronic component 4a or 4b is discarded (step S22). On the other hand, in a case in which thickness Lz1 or thickness Lz2 is less than the allowance value (that is, "Yes" in step S18), because the electronic component 4a or 4b is good, head unit control section 56 drives head moving device 18 such that nozzle 6 of mounting head 16 is positioned above the mounting position on circuit board 2 (step S20). When mounting head 16 has been positioned at the mounting position, head unit control section 56 lowers nozzle 6 and releases electronic component 4a or 4b (step S24). By this, electronic component 4a or 4b is mounted on circuit board 2. Continuing, control device 22 determines whether mounter 10 has completed mounting of all the planned electronic components 4 (step S26). If all the electronic components 4 have been mounted (that is, "Yes" in step S26), mounting work on circuit board 2 by mounter 10 is complete, and if not all electronic components 4 have been mounted (that is, "No" in step S26), processing returns to step S2 and the remaining electronic component 4 mounting work is performed.

With the above mounter 10, the caliper tool is selected in a case in which the size of the side surface in the ZX plane direction of electronic component 4 is less than the threshold value. Therefore, even if the size of the side surface of electronic component 4 is small due to the miniaturization of electronic components, the pickup orientation of electronic component 4 can be appropriately image processed using the caliper tool. As a result, thickness Lz1 of electronic component 4 can be calculated accurately, and electronic component 4 can be accurately mounted at a specified position on circuit board 2. Here, the time taken for image processing per unit of surface area is long because the caliper tool performs image processing in sub-pixel units. However, in the present embodiment, because the small image processing range 60 is automatically selected when the caliper tool is selected, the increase in time for image processing the entire image processing range 60 is curtailed. On the other hand, mounter 10 selects the large image processing range 62 when the size of the side surface of electronic component 4 is equal to or greater than the threshold value. Generally, image processing time increases if the image processing range is larger. However, with the present embodiment, the binarization method is automatically selected when image processing range 62 is selected. Because the binarization method is an image processing method with relatively low accuracy, the processing time per unit of surface area is relatively fast. Therefore, the increase in time for image processing the entire image processing range 62 is curtailed. Also, in a case in which the size of the side surface of electronic component 4 is equal to or greater than the threshold value, because the allowance value is also large, so long as the image processing accuracy is maintained to a certain degree, the pickup orientation of electronic component 4 can be inspected with sufficient accuracy. By this, electronic component 4 can be mounted accurately at the specified position on circuit board 2 using the binarization method. Therefore, according to mounter 10, electronic components 4 with various side surface sizes can be image processed accurately, and the increase in image processing time can be curtailed.

Figure 5:
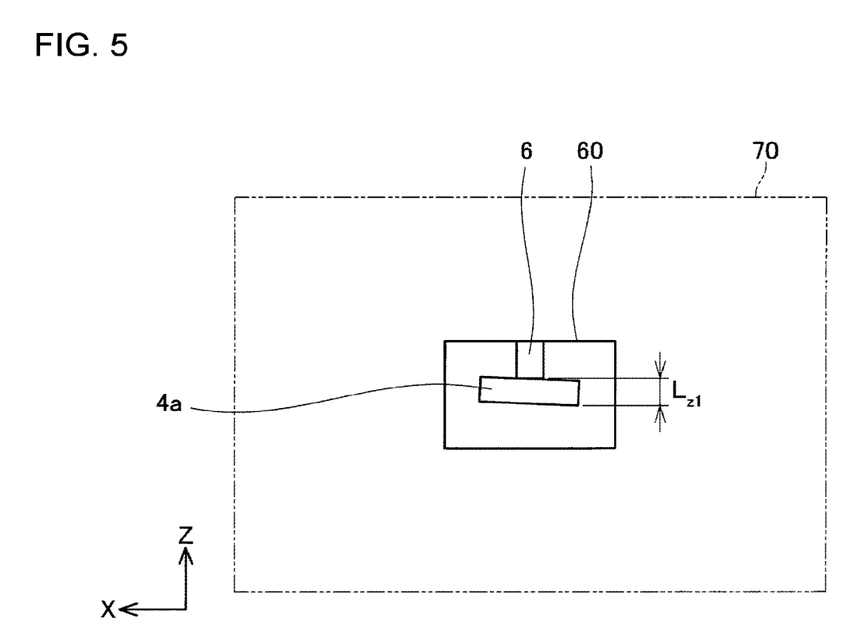
FIG. 5 is an example of an image processing range.

Also, image processing range 60 is set to be a range larger than the outline of electronic component 4a (that is, an electronic component with a small side surface) when looking from the −Y direction, and image processing range 62 is set to be a range larger than the outline of electronic component 4b (that is, an electronic component with a large side surface) when looking from the −Y direction. According to this configuration, because the overall outline of the side surface of electronic component 4 is a target for image processing, it is possible to accurately inspect the pickup orientation of electronic component 4. Also, if a memorizing section that can save image processed data is provided in memory 40 of control device 22, when a problem is detected with circuit board 2, it is possible to check the image processed data memorized on the memorizing section, and the cause of the problem can be easily found.

Further, with the present embodiment, threshold memorizing section 49 memorizes one set of threshold values (Lxth, Lzth), and image processing range memorizing section 46 and image processing method memorizing section 48 each memorize only two types of image processing ranges 60, and 62, and image processing methods (caliper tool and binarization method). Therefore, image processing pattern selecting section 50 can select the image processing range and the image processing accuracy quickly based on the threshold value, thus improving mounting efficiency of electronic component 4.

Also, with the present embodiment, the range and accuracy for image processing image data is changed based on the size of the side surface of electronic component 4. Therefore, there is no need to use a separate imaging device with a high resolution for image processing electronic components 4 with a small side surface. Just by providing one imaging device 30 in mounter 10, it is possible to image processing electronic components 4 with various sizes of side surfaces with appropriate accuracy. Therefore, it is possible to avoid an increase in mounter costs due to introducing a separate imaging device, and to avoid making the size of the mounter larger. Further, image processing pattern selecting section 50 only selects the high resolution image processing method of the caliper tool when the size of the side surface of electronic component 4 is less than the threshold (that is, when high accurate image processing is required). In other words, when image processing electronic components 4 for which highly accurate image processing is not required, the low accuracy vision processing method of the binarization method is selected. Therefore, compared to a case in which only the caliper tool is used as the image processing method, it is possible to curtail the increase in time for image processing, and as a result it is possible to curtail a deterioration in the mounting efficiency.

Embodiment 2

Figure 8:
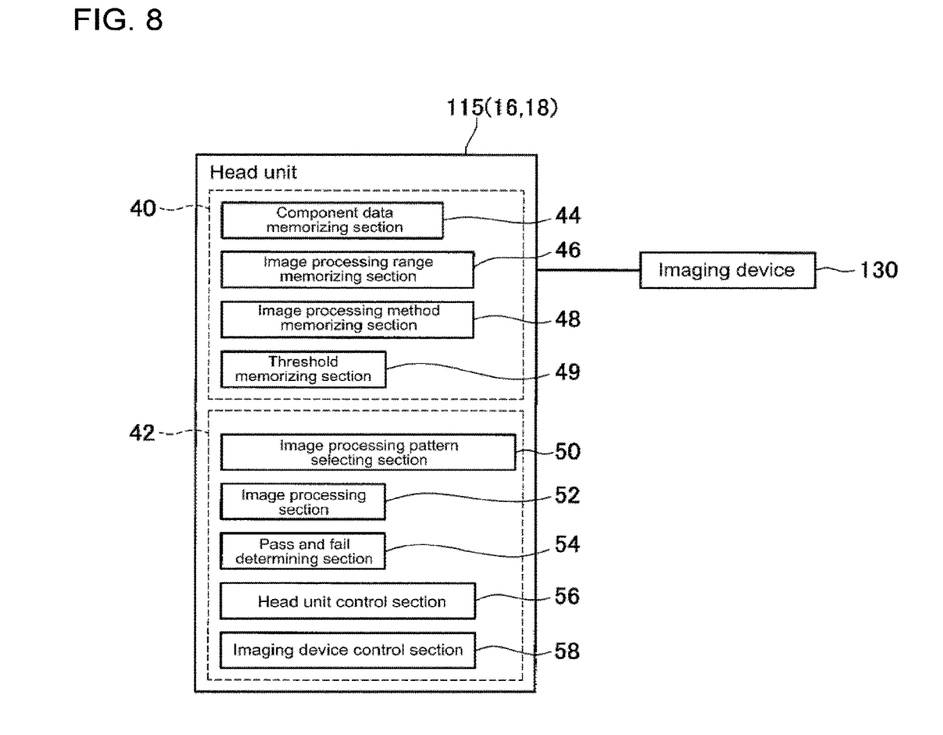
FIG. 8 is a block diagram showing functions of a head unit of a second embodiment.

Next, head unit 115 of a second embodiment is described with reference to FIG. 8. Below, only elements that are different to the first embodiment are described, elements the same as the first embodiment are given the same reference signs and detailed descriptions thereof are omitted. Head unit 115 of the second embodiment is different from head unit 15 of the first embodiment with regard to the configuration using a computer that includes memory 40 and CPU 42. Imaging device 130 is an imaging device that images the pickup orientation of electronic component 4 picked up by nozzle 6, and is provided with the same configuration as image device 30 of the first embodiment. Imaging device 130 is fixed to moving base 18a (one configuration element of head unit 115) by fixing member 29, and moves together with moving base 18a. The same memorizing sections 44, 46, 48, and 49 as the first embodiment are provided in memory 40. Also, CPU 42 functions as sections 50, 52, 54, 56, and 58 the same as in the first embodiment. Head unit control section 56 controls operation of head unit 115, and imaging device control section 58 controls operation of imaging device 130. That is, in this embodiment, head unit 115 functions as control device 22 of the first embodiment. With this configuration too, it is possible to achieve the same effects as the first embodiment. Also, in this embodiment, because control device 22 is not required, mounter 10 is smaller by that amount. Note that, imaging device 130 corresponds to an example of a "head-side imaging device."

The above described in detail embodiments of the technology disclosed by this specification, but these are merely an example, and the mounter disclosed herein includes items with various changes and modifications made to the above embodiments.

For example, in an embodiment above, only one set of threshold values is memorized in threshold memorizing section 49, but the configuration is not limited to this. For example, two or more sets of threshold values may be memorized. In this case, a "threshold value quantity+1" quantity of image processing ranges is memorized in image processing range memorizing section 46, and a "threshold value quantity+1" quantity of image processing methods is memorized in image processing method memorizing section 48. According to such a configuration, it is possible to inspect the pickup orientation of electronic component 4 with an image processing range and an image processing accuracy adapted to the size of the side surface of electronic component 4. Also, in a case in which two or more threshold values are memorized, the quantity of image processing ranges may be "threshold value quantity+1," and the quantity of image processing methods may be less than "threshold value quantity+1." In this case, the image processing method is the same, but the image processing range is changed based on the size of the side surface of electronic component 4.

Further, in an embodiment above, imaging device 30 is fixed to moving base 18a of head unit 15, but the configuration is not limited to this. For example, imaging device 30 may be provided near component feeder 12. Also, two types of imaging devices may be provided, one fixed to moving base 18a and one provided near component feeder 12. In this case, the imaging device fixed to moving base 18a may image width Lx and thickness Lz of electronic component 4, and the imaging device provided near component feeder 12 may image depth Ly (refer to FIG. 4) of electronic component 4. In this case, a new threshold value Lyth of electronic component 4 is memorized in threshold memorizing device 49, and image processing is performed by selecting imaging processing range 60 and the caliper tool when the condition Ly<Lyth is satisfied. Conversely, when this condition is not satisfied, image processing is performed by selecting imaging processing range 62 and the binarization method. By this, electronic component 4 can be mounted even more accurately on circuit board 2.

Further, in an embodiment above, thresholds (Lxth, Lzth) in the X direction and Z direction are set in step S2, but the configuration is not limited to this. For example, in a case in which component 4 is imaged from the −Y direction, image processing pattern selecting section 50 may select the image processing range and accuracy based on only the threshold value in the Z direction (that is, proceed to step S14 when Lz<Lzth). As the directions for which a threshold value is set decrease, the quantity of electronic components 4 image processed using the caliper tool increases.

Further, the image processing methods are not limited to the caliper tool and binarization method, for example, a smoothing filter or pixel shifting (high resolution) method may be used. Also, when setting threshold values, a different value may be set for each type of circuit board 2. And, calculations made by image processing section 52 are not limited to thickness Lz of electronic component 4, width Lx or a position correction amount of electronic component 4 may be calculated.

Details of specific examples of the present disclosure are described above, but these are merely examples and in no way restrict the claims of the disclosure. The techniques disclosed in the claims include various changes and modifications to the specific examples illustrated above. Also, technical elements described in this specification and in the figures exhibit technical utility alone or in various combinations, and are not limited to the combination of the described aspects of the application. Also, the examples of the technology in this specification and the figures achieves multiple purposes at the same time but can also exhibit technical utility by achieving one among those purposes.

The invention claimed is:

1. A mounter comprising:
   a head unit that includes a suction nozzle capable of picking up an electronic component and is configured to transfer the electronic component to a specified position on a circuit board;
   an imaging device configured to image a pickup orientation of the electronic component picked up by the suction nozzle; and
   circuitry configured to:
   extract component data of the electronic component to be transferred by the head unit, move the head unit to a component feeder that supplies the electronic component, image a lower section of the suction nozzle using the imaging device and calculate a lower limit of the suction nozzle, pick up the electronic component by lowering the suction nozzle, image a side surface of the electronic component and the lower section of the suction nozzle using the imaging device, compare a size of the image of the side surface of the electronic component to a predetermined threshold value, process the image of the side surface of electronic component using a first image processing method to determine a thickness of the electronic component when the size of the image of the side surface of the electronic component is greater than the predetermined threshold, process the image of the side surface of the electronic component using a second image processing method to determine the thickness of the electronic component when the size of the image of the side surface of the electronic component is less than the predetermined threshold, compare the determined thickness of the electronic component with an allowance value, and transfer the electronic component to the specified position on the circuit board when the determined thickness of the electronic component is less than the allowance value, wherein the first image processing method includes a first image processing range and a first image processing accuracy, and the second image processing method includes a second image processing range and a second image processing accuracy, the second image processing range being greater than the first image processing range, and the first image processing accuracy being greater than the second image processing accuracy, and an imaging range of the imaging device is fixed.

2. The mounter according to claim 1, further comprising a memory configured to memorize sizes of the first and second image processing ranges.

3. A head unit comprising:

a suction nozzle capable of picking up an electronic component, the head unit being configured to transfer the electronic component picked up by the suction nozzle to a specified position on a circuit board;

a head-side imaging device capable of being attached to the head unit and configured to image a pickup orientation of the electronic component picked up by the suction nozzle; and circuitry configured to:

extract component data of the electronic component to be transferred by the head unit, move the head unit to a component feeder that supplies the electronic component, image a lower section of the suction nozzle using the head-side imaging device and calculate a lower limit of the suction nozzle, pick up the electronic component by lowering the suction nozzle, image a side surface of the electronic component and the lower section of the suction nozzle using the head-side imaging device, compare a size of the image of the side surface of the electronic component to a predetermined threshold value, process the image of the side surface of electronic component using a first image processing method to determine a thickness of the electronic component when the size of the image of the side surface of the electronic component is greater than the predetermined threshold, process the image of the side surface of the electronic component using a second image processing method to determine the thickness of the electronic component when the size of the image of the side surface of the electronic component is less than the predetermined threshold, compare the determined thickness of the electronic component with an allowance value, and transfer the electronic component to the specified position on the circuit board when the determined thickness of the electronic component is less than the allowance value, wherein the first image processing method includes a first image processing range and a first image processing accuracy, and the second image processing method includes a second image processing range and a second image processing accuracy, the second image processing range being greater than the first image processing range, and the first image processing accuracy being greater than the second image processing accuracy, and an imaging range of the head-side imaging device is fixed.

4. An electronic component pickup orientation inspection method for inspecting the pickup orientation of the electronic component picked up by a suction nozzle of a mounter configured to mount the electronic component picked up by the suction nozzle at a specified location on a board, the method comprising:

extracting component data of the electronic component to be picked up by suction nozzle;

moving the suction nozzle to a component feeder that supplies the electronic component;

imaging a lower section of the suction nozzle using a head-side imaging device and calculating a lower limit of the suction nozzle;

picking up the electronic component by lowering the suction nozzle;

imaging a side surface of the electronic component and the lower section of the suction nozzle using the head-side imaging device;

comparing a size of the image of the side surface of the electronic component to a predetermined threshold value;

processing the image of the side surface of electronic component using a first image processing method to determine a thickness of the electronic component when the size of the image of the side surface of the electronic component is greater than the predetermined threshold;

processing the image of the side surface of the electronic component using a second image processing method to determine the thickness of the electronic component when the size of the image of the side surface of the electronic component is less than the predetermined threshold;

comparing the determined thickness of the electronic component with an allowance value; and transfering the electronic component to the specified position on the circuit board when the determined thickness of the electronic component is less than the allowance value, wherein the first image processing method includes a first image processing range and a first image processing accuracy, and the second image processing method includes a second image processing range and a second image processing accuracy, the second image processing range being greater than the first image processing range, and the first image processing accuracy being greater than the second image processing accuracy, and an imaging range of the head-side imaging device is fixed.

5. The mounter according to claim 1, wherein the first image processing method is a caliper tool, and the second image processing method is a binarization method.

6. The head unit according to claim 3, wherein the first image processing method is a caliper tool, and the second image processing method is a binarization method.

7. The method according to claim 4, wherein the first image processing method is a caliper tool, and the second image processing method is a binarization method.

* * * * *